US009768778B2

(12) United States Patent
Kwon et al.

(10) Patent No.: US 9,768,778 B2
(45) Date of Patent: Sep. 19, 2017

(54) HIGH VOLTAGE LEVEL SHIFTER IN ULTRA LOW POWER SUPPLY MEMORY APPLICATION

(71) Applicant: SEMICONDUCTOR MANUFACTURING INTERNATIONAL (SHANGHAI) CORPORATION, Shanghai (CN)

(72) Inventors: Yi Jin Kwon, Shanghai (CN); Hao Ni, Shanghai (CN); Yu Cheng, Shanghai (CN); Hong Yu, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 15/093,716

(22) Filed: Apr. 7, 2016

(65) Prior Publication Data

US 2016/0336940 A1 Nov. 17, 2016

(30) Foreign Application Priority Data

May 14, 2015 (CN) .......................... 2015 1 0246614

(51) Int. Cl.
*H03K 19/0185* (2006.01)

(52) U.S. Cl.
CPC ........................ *H03K 19/018507* (2013.01)

(58) Field of Classification Search
CPC ....... H03K 19/0175; H03K 19/018507; H03K 19/018521; H03K 5/003
See application file for complete search history.

(56) References Cited

U.S. PATENT DOCUMENTS

| 6,556,061 B1* | 4/2003 | Chen ................. H03K 17/102 327/333 |
| 7,884,643 B2* | 2/2011 | Wang ................. H03K 3/012 326/68 |
| 2008/0129365 A1* | 6/2008 | Chang .............. H03K 3/356034 327/333 |

* cited by examiner

*Primary Examiner* — Patrick O'Neill
(74) *Attorney, Agent, or Firm* — Kilpatrick Townsend & Stockton LLP

(57) ABSTRACT

A high voltage level shifter includes a first high-voltage P-channel metal oxide semiconductor (HVPMOS) transistor, a second HVPMOS transistor, a discharge transistor having a first native high-voltage N-channel metal oxide semiconductor (HVNMOS) transistor and a first low-voltage N-channel metal oxide semiconductor (LVNMOS) transistor connected in series, and an avalanche transistor having a second HVNMOS transistor and a second LVNMOS transistor connected in series.

15 Claims, 6 Drawing Sheets

HIGH VOLTAGE LEVEL SHIFTER IN ULTRA LOW POWER SUPPLY MEMORY APPLICATION

CROSS-REFERENCES TO RELATED APPLICATIONS

This application claims priority to Chinese patent application No. 201510246614.2, filed May 14, 2015, the content of which is incorporated herein by reference in its entirety.

FIELD OF INVENTION

The present invention relates to semiconductor technology. More particularly, embodiments of the present invention relate to a high-voltage level shifter circuit.

BACKGROUND OF THE INVENTION

Most of the memory operations include voltage level shifting features (e.g., word line driver and bit line driver). Therefore, most of non-volatile memory devices, such as flash memory, EEPROM) include high voltage level shifters configured receive an input signal at a first voltage and provide an output signal at a higher voltage (about 10 V to 16 V). The higher voltage may be from an analog pumping block during a write operation. Because the threshold voltage Vt of high voltage N-channel metal-oxide semiconductor (NMOS) transistors and high voltage P-channel metal-oxide semiconductor (PMOS) transistors is about 0.8 V, or close to 1.0 V under worst conditions, high-voltage level shifters cannot operate with a very low-power supply voltage (approximately 1 V). FIG. 1 is a circuit diagram of a conventional 4-transistor high-voltage level shifter 100, which includes two high-voltage NMOS transistors and two high-voltage PMOS transistors. When the input IN is at 0 V, a node denoted "node" is set to 1.35 V to 1.65 V, and the output OUT is at the voltage VHH. When the input IN changes from 0 V to 1.35-1.65 V, the output OUT is at 0 V. The NMOS and PMOS transistors are high voltage transistors.

FIG. 2 is a circuit diagram of a conventional 6-transistor high-voltage level shift circuit. Two more NMOS transistors are added to limit the maximum voltage seen by any gate oxide in the circuit. This technique is referred to as cascading. Thus, the number of the NMOS and PMOS transistors depends from the high-voltage transfer capability. In particularly, in the case of discharge, the threshold voltage Vt of a high-voltage NMOS (referred to as HVNMOS hereinafter) transistor has a close relationship with the discharge voltage. For example, in low power supply applications (e.g., 1.2 V), the higher the threshold voltage Vt of the HVNMOS transistor, the slower the discharge rate.

As semiconductor processes continue to be scaled down, the supply voltage also has to be reduced to accommodate the thin oxide layer of MOS transistors. Conventional high voltage level shifters can operate at a supply voltage of 1.2 V, but cannot operate in ultra-low power supply voltage applications (e.g., lower than 1 V).

Thus, there is a need to provide a novel voltage level shifter to overcome the drawbacks of the prior art.

BRIEF SUMMARY OF THE INVENTION

Embodiments of the present invention provide a high-voltage level-shifter. The high voltage level shifter includes a first high-voltage P-channel metal oxide semiconductor (HVPMOS) transistor, a second HVPMOS transistor, a discharge transistor comprising a first native high-voltage N-channel metal oxide semiconductor (HVNMOS) transistor and a first low-voltage N-channel metal oxide semiconductor (LVNMOS) transistor connected in series, and an avalanche transistor comprising a second HVNMOS transistor and a second LVNMOS transistor connected in series.

In one embodiment, a gate of the second LVNMOS transistor and a gate of second native HVNMOS transistor are connected to an input terminal, a source of the first LVNMOS transistor and a drain of the first native HVNMOS transistor are connected together, a gate of the first LVNMOS transistor and a gate of the first native HVNMOS transistor are connected to a voltage supply VDD, and a source of the first native HVNMOS transistor, a drain of first HVPMOS transistor, and a gate of the second HVPMOS transistor are connected to each other.

In one embodiment, the input terminal has a voltage level equal to or less than 1.0 V, and the voltage supply VDD has a voltage level equal to or less than 1.0 V.

In one embodiment, a source of the first HVPMOS transistor and a source of the second HVPMOS transistor are connected to a supply voltage VHH, and a gate of the first HVPMOS transistor, a drain of the second HVPMOS transistor, and a source of the second native HVNMOS transistor are connected to an output terminal.

In one embodiment, a drain of the first HVPMOS transistor and a source of the second LVNMOS transistor are connected together. A drain of the second LVNMOS transistor, a substrate of the first LVNMOS transistor, a substrate of the native HVNMOS transistor, a substrate of the second native HVNMOS transistor, and a substrate of the second LVNMOS transistor are connected to a supply voltage VSS.

In one embodiment, the high-voltage level-shifter may include a common gate bias supply voltage. The high-voltage level-shifter may include a constant single supply voltage.

In one embodiment, the avalanche transistor is a common gate bias transistor.

In one embodiment, a gate of the second LVNMOS transistor and a gate of second native HVNMOS transistor are connected to an input terminal, a source of the first LVNMOS transistor and a drain of the first native HVNMOS transistor are connected together, a gate of the first LVNMOS transistor and a gate of the first native HVNMOS transistor are connected to a supply voltage VDD, a source of the first native HVNMOS transistor, a drain of first HVPMOS transistor, and a gate of the second HVPMOS transistor are connected to each other, a source of the first HVPMOS transistor and a source of the second HVPMOS transistor are connected to a supply voltage VHH, and a gate of the first HVPMOS transistor, a drain of the second HVPMOS transistor, and a source of the second native HVNMOS transistor are connected to an output terminal. In the event that a voltage level of 1.0 V or less is applied to the input terminal, the output terminal includes a voltage level that is about a voltage level of VHH.

In one embodiment, the supply voltage VDD has a voltage level of 1.0 V or less, and the supply voltage VDD is greater than VDD The following description, together with the accompanying drawings, will provide a better understanding of the nature and advantages of the claimed invention.

DETAILED DESCRIPTION OF THE INVENTION

The present invention will be described in detail together with the accompanying drawings. It will be appreciated that, without conflict, the disclosed exemplary embodiments and exemplary features can be combined with each other.

Figure 3:
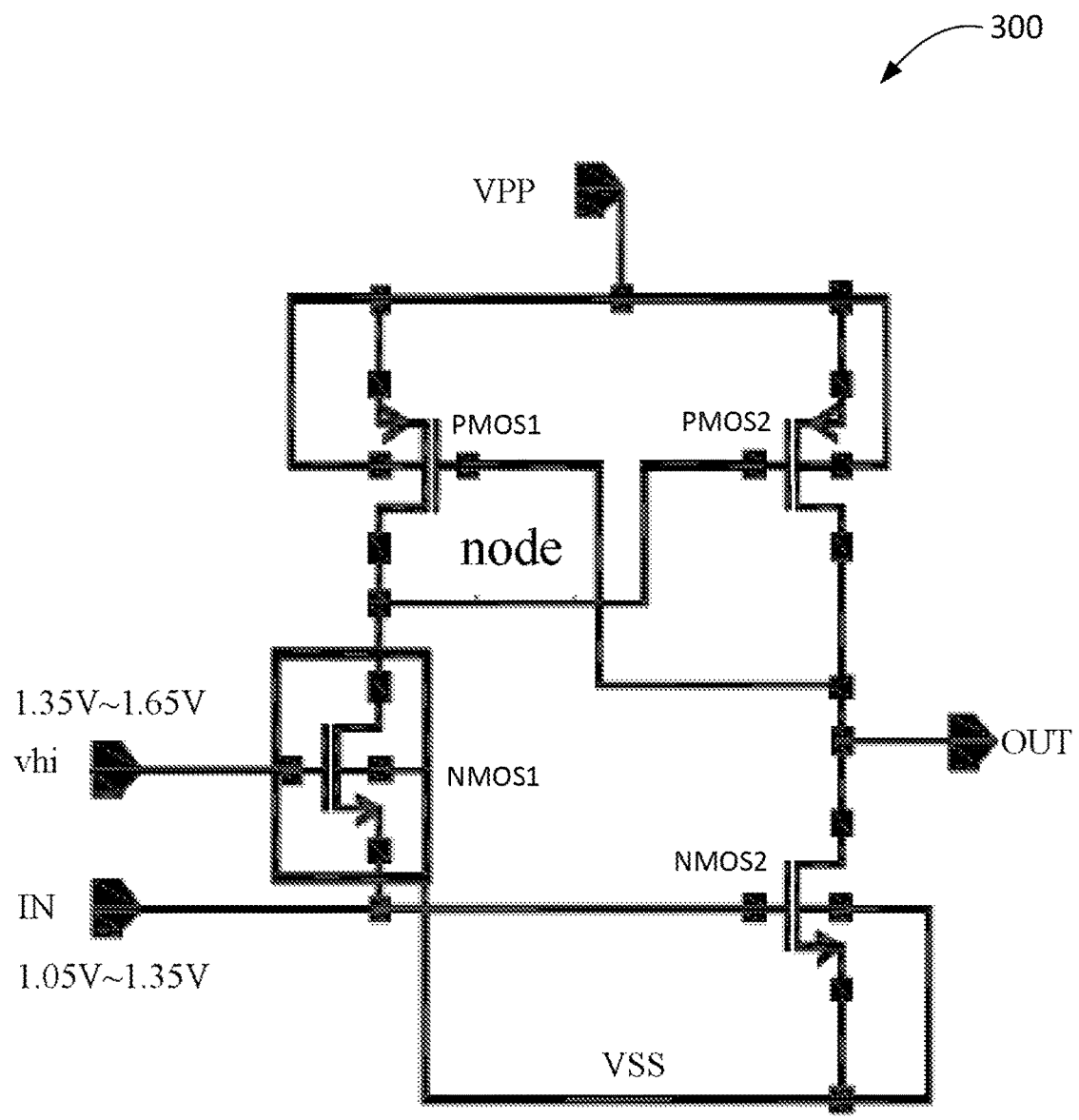
FIG. 3 is a circuit diagram of yet another conventional gate-biased high-voltage level shifter.

FIG. 3 is a circuit diagram of a conventional gate-biased high voltage level shifter 300. High voltage level shifter 300 includes a first PMOS transistor PMOS1 and a first NMOS transistor NMOS1 connected in series, and a second PMOS transistor PMOS2 and a second NMOS transistor NMOS2 connected in series. A gate of the first NMOS transistor NMOS1 is connected to a bias voltage vhi, and a gate of second transistor NMOS2 is connected to an input signal IN. The sources of the first and second PMOS transistors are connected to a power voltage VPP. The input signal IN swings between 1.05 V to 1.35 V and ground. In operation, when a low logic level signal (0 V) is applied to the input IN, the first NMOS transistor NMOS1 is turned on to discharge the node denoted "node," the second PMOS transistor PMOS is turned on, so that the power voltage VPP appears at the output OUT. Conversely, when a high logic level (1.05 V to 1.35 V) is applied to the input IN, the second NMOS transistor NMOS2 is turned on to pull the output voltage OUT to ground (VSS) and turn on the first PMOS transistor PMOS1. The node "node" changes from 0 V to VPP and turn off the second PMOS transistor PMOS2. Referring to FIG. 3, the NMOS 2 transistor is biased at a fixed bias voltage, which is different from the input signal IN. The high-voltage level shifter uses a dual power supply.

Figure 4:
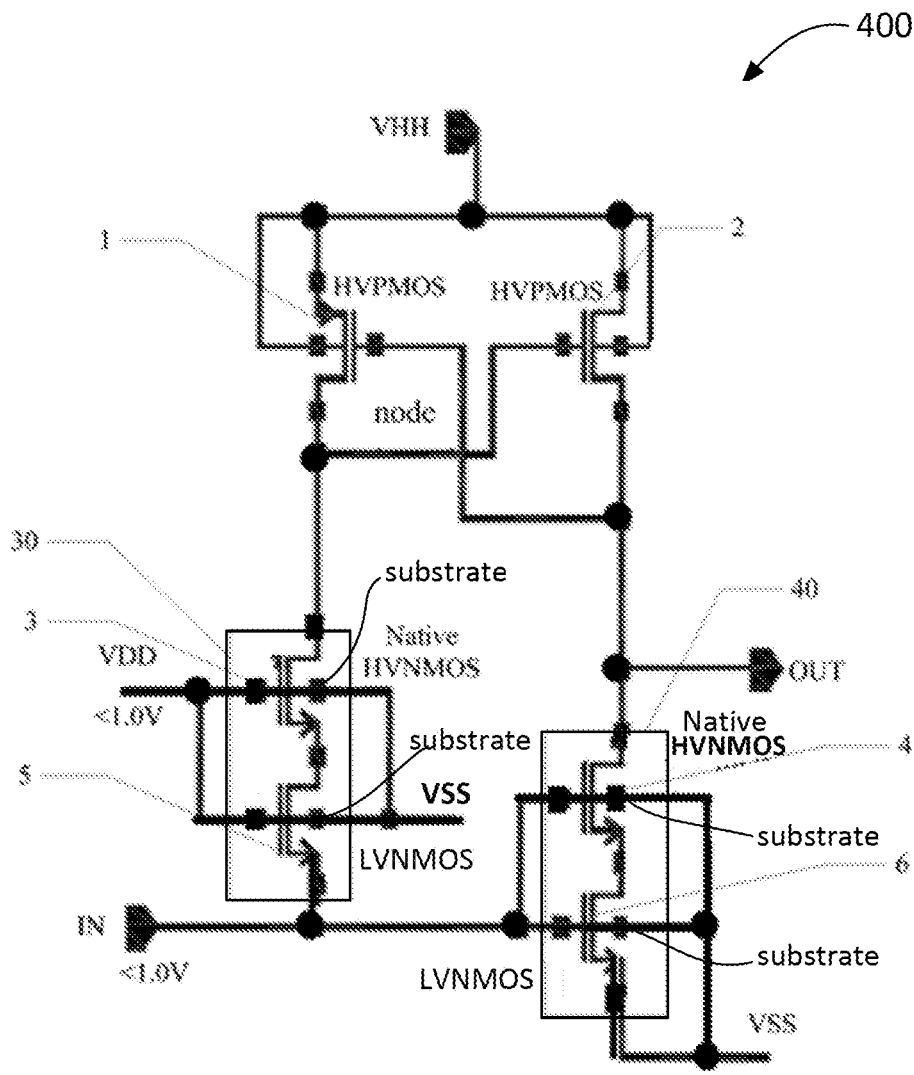
FIG. 4 is a circuit diagram of a high-voltage level shifter according to an embodiment of the present invention.

FIG. 4 is a circuit diagram of a high-voltage level shifter 400 according to an embodiment of the present invention. Referring to FIG. 4, high-voltage level shifter 400 includes a first HVPMOS transistor 1, a second HVPMOS transistor 2, a discharge transistor 30, and an avalanche transistor 40. Discharge transistor 30 includes a first native high-voltage NMOS transistor 3 and a first low voltage NMOS transistor 5 connected in series. The avalanche transistor 40 includes a second native high-voltage NMOS transistor 4 and a second low voltage NMOS transistor 6 connected in series.

In the embodiment of the present invention, discharge transistor 30 and avalanche transistor 40 are formed of first native HVNMOS transistor 3, second native HVNMOS transistor 4, first LVNMOS transistor 5, and second LVNMOS transistor 6. These four transistors 3, 4, 5, 6 are low voltage transistors. Thus, although HVNMOS transistors may cause a slower discharge time, but because the four transistors are low-voltage transistors in the embodiment, the discharge time of the high-voltage level shifter is relatively fast.

In the embodiment, the high-voltage level shifter uses HVNMOS transistors and low-voltage NMOS transistors to replace the HVNMOS transistors. Since an ultra-low power supply voltage (<1 V) can affect the discharge rate of a high-voltage NMOS transistor, therefore, in accordance with the present invention, the high-voltage level shifter uses a conventional common gate bias with a low-voltage high-voltage NMOS (i.e., native HVNMOS) instead of a high-voltage NMOS transistor. The use of a LVNMOS transistor also ensures the leakage protection of the native HVNMOS. The term "native transistor" (also known as a "natural transistor") refers to a type of metal oxide semiconductor transistor that has zero or near-zero threshold voltage.

Figure 1:
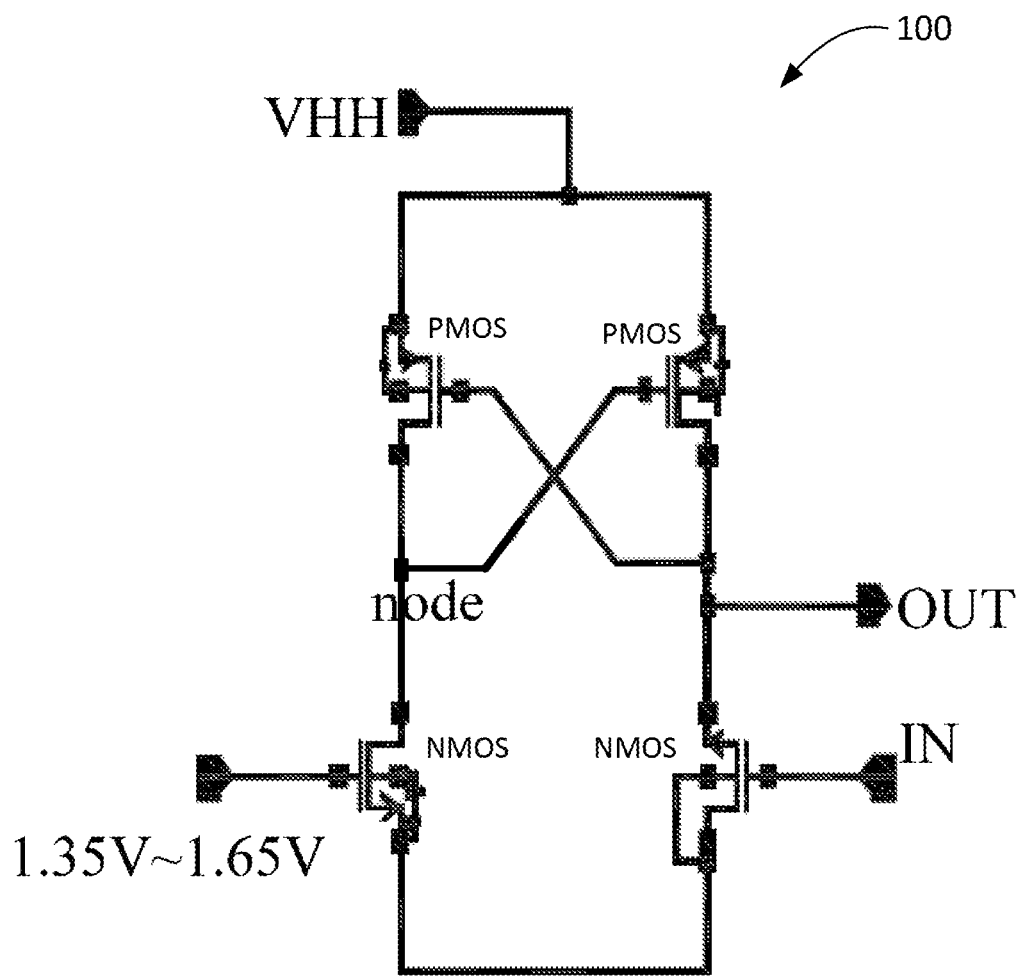
FIG. 1 is a circuit diagram of a conventional high-voltage level shifter.
Figure 2:
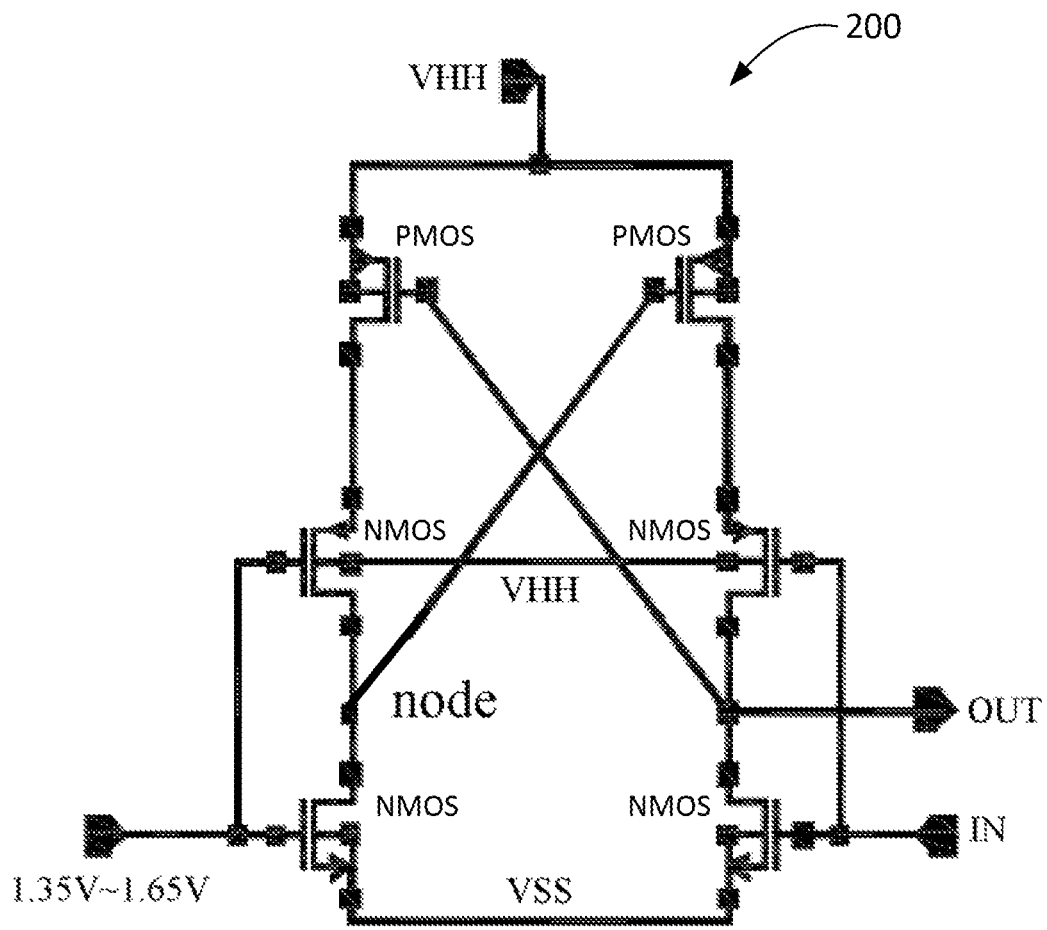
FIG. 2 is a circuit diagram of another conventional high-voltage level shifter.

FIG. 4 is a circuit diagram illustrating an improved four-transistor high-voltage level shifter (HVLS) relative to the circuit diagram of the conventional HVLS of FIG. 1. As shown in FIG. 4, a source of first LVMOS transistor 5, a gate of second LVNMOS transistor 6, and a gate of second native HVNMOS transistor 4 are connected to an input terminal IN. A source of first LVNMOS transistor 5 and a drain of first native HVNMOS transistor 4 are connected together. A gate of first LVNMOS transistor 5 and a gate of first native HVNMOS transistor 3 are connected to a power supply VDD. A source of first native HVNMOS transistor 3, a source of first HVPMOS transistor 1, and a gate of second HVPMOS transistor 2 are connected to each other. A source of first HVPMOS transistor 1 and a source of second HVPMOS transistor 2 are connected to a power supply VHH. A gate of first HVPMO transistor 1, a drain of second HVPMOS transistor 2, and a source of second native HVNMOS transistor 4 are connected to an output terminal OUT. A drain of second native HVNMOS transistor 4 and a drain of second LVNMOS transistor 6 are connected together. A source of second LVNMOS transistor 6, a substrate of first LVNMOS transistor 5, a substrate of first native HVNMOS transistor 3, a substrate of second native HVNMOS transistor 4, and a substrate of second LVNMOS transistor 6 are connected to a supply voltage VSS. The supply voltage VHH is higher than the supply voltage VDD. The supply voltage VSS may be at ground potential.

In an embodiment, the supply voltage VDD may be 1.0 V and below, and the supply voltage VHH is 2.0V and above.

In an alternative embodiment, the HVLS circuit may be a common gate bias power supply.

In an exemplary embodiment, the HVLS circuit may use a fixed (constant) single supply voltage. For example, the HVLS circuit may use a conventional constant gate bias and constant single supply voltage.

In some embodiments, avalanche transistor 40 may be a common gate bias transistor.

In one embodiment of the present invention, the input terminal IN is 0 V, the bias voltage VHH is transferred through second HVPMOS transistor 2 to the output terminal OUT. At this time, first HVPMOS transistor 1 is turned off. Accordingly, the voltage level at the node denoted "node" at the source of the discharge transistor 30 (including first native HVNMOS transistor 3 and first LVNMOS transistor 5) is 0 V, and avalanche transistor 40 (including second native HVNMOS transistor 4 and second LVNMOS transistor 6) is turned off. Conversely, when the input terminal IN is VDD, the voltage level of the node "node" is VDD. Accordingly, second HVPMOS transistor 2 is turned off, first HVPMOS transistor 1 is turned on, the voltage level at the node "node" is at VHH. Second native HVNMOS transistor 4 and second LVNMOS transistor 6 are turned on, so that the output terminal OUT is 0 V.

Figure 5:
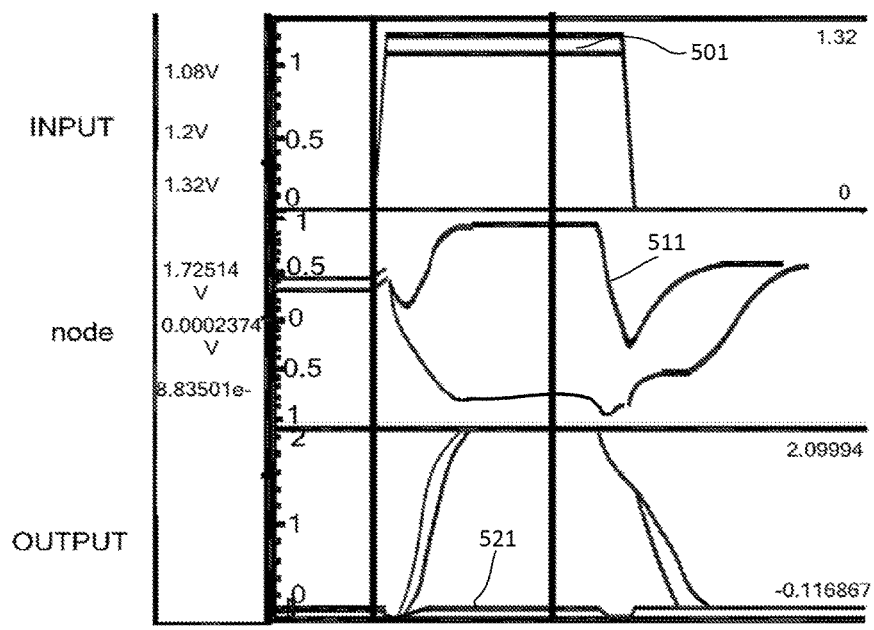
FIG. 5 is a graph illustrating the voltage relationship between an input, an internal node, and an output of a conventional gate-biased high-voltage level shifter.

FIG. 5 is a graph illustrating the voltage relationship between the input, internal node, and output of a conventional gate-biased high-voltage level shift (HVLS) circuit. As shown in FIG. 5, the conventional HVLS circuit does not operate correctly when the input signal "INPUT" 501 has a voltage below 1.08 V, the voltage 511 at the "node" may stay high (above 1.72 V), and the output voltage 521 at the output terminal "OUTPUT" is around 0 V.

Figure 6:
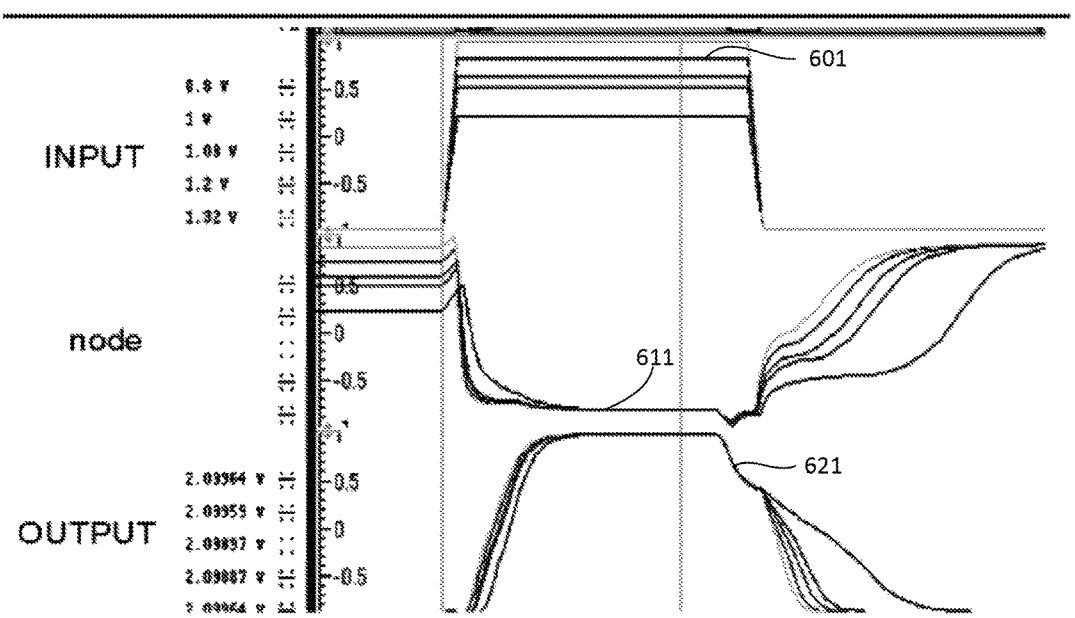
FIG. 6 is a graph illustrating the voltage relationship between an input, an internal node, and an output of a high-voltage level shifter according to an embodiment of the present invention.

FIG. 6 is a graph illustrating the voltage relationship between the input, internal node, and output of a high-voltage level shifter according to an embodiment of the present invention. As shown in FIG. 6, although a voltage 601 of below 0.8 V is applied to the input terminal INPUT, the voltage 611 of the "node" still remains at a low level, and the voltage 621 at the output terminal "OUTPUT" is over 2.1 V. In other words, the HVLS circuit according to the present invention still can shift the input signal of 0.8 V to a higher voltage level of 2.1V at the output terminal OUTPUT. Furthermore, because of the use of low voltage HVNMOS and LVNMOS transistors, the discharge time can be improved.

As is clearly shown in FIG. 6, the HVLS circuit, in accordance with the present invention, can operate at a voltage level lower than the conventional HVLS circuit as shown in FIG. 5. Furthermore, the novel HVLS circuit of the present invention has a faster discharge time than that of the conventional HVLS circuit.

Figure 7:
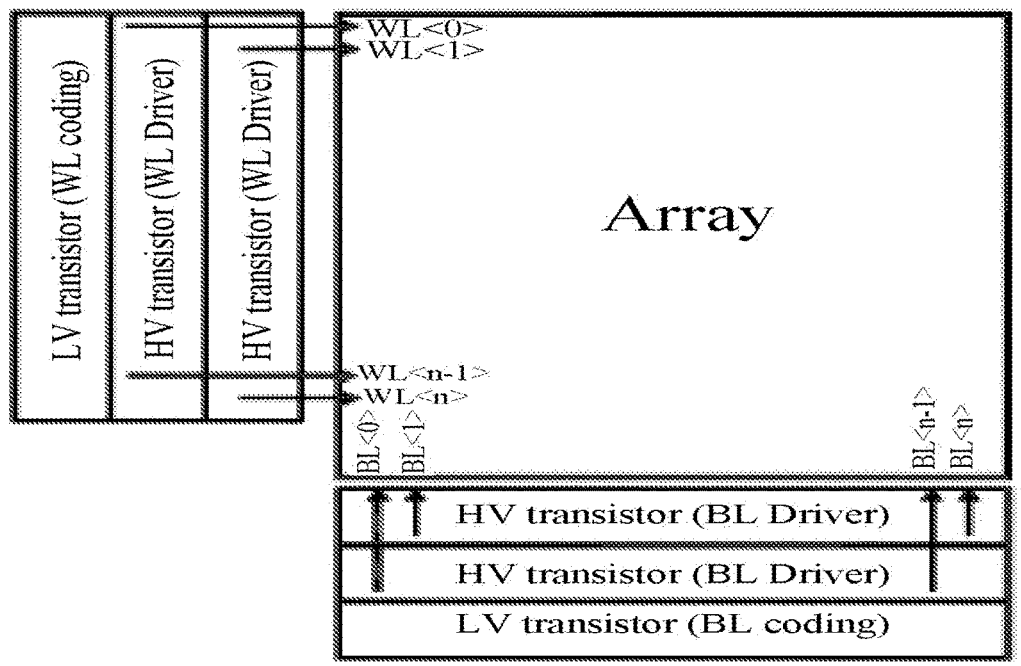
FIG. 7 is a schematic layout structure illustrating an arrangement of conventional high-voltage level shifters in an array of memory cells.

FIG. 7 is a schematic layout structure of conventional high voltage level shifters of an array of memory cells, as known in the art. As shown in FIG. 7, because of the issues of the word line region and bit line region, the HLVS circuit is divided into a high voltage transistor region and a low-voltage transistor region. As shown, the high voltage transistors for bitline drivers are grouped together in a high voltage region and the low voltage transistors for the bitline coding are grouped in a low voltage region. Similarly, the high voltage transistors for wordline drivers are grouped together in a high voltage region and the low voltage transistors for the wordline coding are grouped in a low voltage region.

Figure 8:
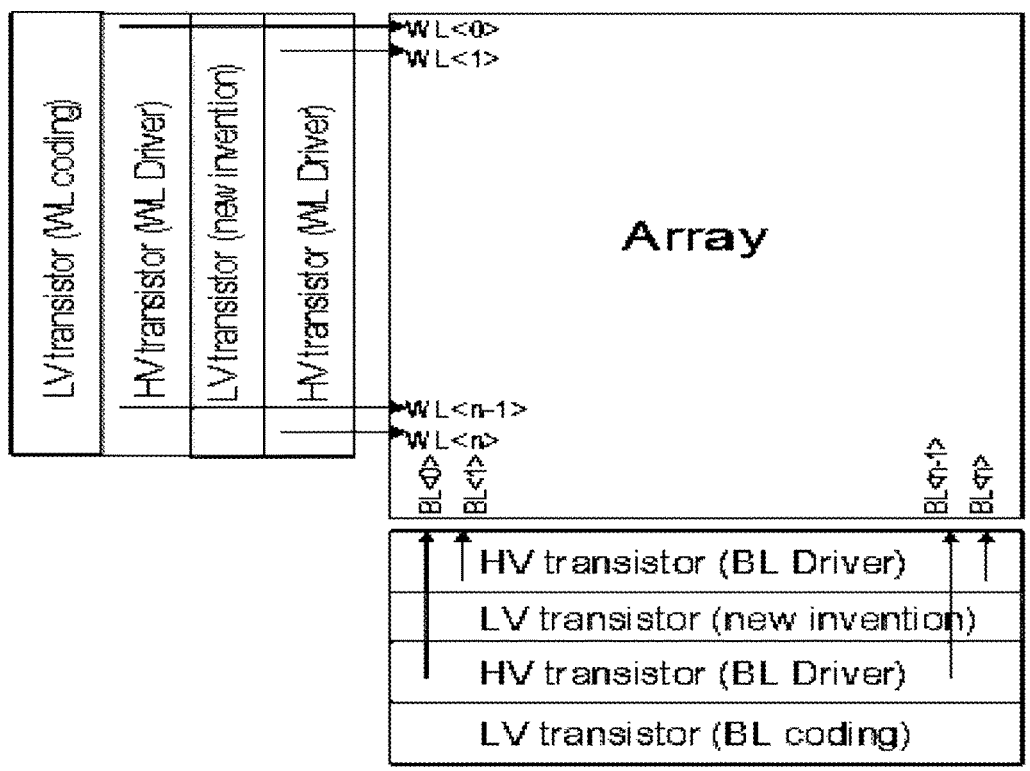
FIG. 8 is a schematic layout structure illustrating an arrangement of high-voltage level shifters in an array of memory cells according to an embodiment of the present invention.

FIG. 8 is an array layout structure of a HVLS circuit according to an embodiment of the present invention. Due to the use of low-voltage transistors, the HVLS circuit according to the present invention does not have the layout complexity problems associated with the conventional HVLS of FIG. 7. For example, portions of the high voltage level shifters can be distributed and designed optimally in the low voltage transistor region.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments as well as other embodiments will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. A high-voltage level-shifter comprising:
   a first high-voltage P-channel metal oxide semiconductor (HVPMOS) transistor;
   a second HVPMOS transistor;
   a discharge transistor comprising a first native high-voltage N-channel metal oxide semiconductor (HVNMOS) transistor and a first low-voltage N-channel metal oxide semiconductor (LVNMOS) transistor connected in series;
   an avalanche transistor comprising a second native HVNMOS transistor and a second LVNMOS transistor connected in series; and
   an input terminal connected to a gate of the second LVNMOS transistor and a gate of the second native HVNMOS transistor.

2. The high-voltage level-shifter of claim 1, wherein:
   a gate of the first LVNMOS transistor and a gate of the first native HVNMOS transistor are connected to a voltage supply VDD; and
   a drain of the first native HVNMOS transistor, a drain of first HVPMOS transistor, and a gate of the second HVPMOS transistor are connected to each other.

3. The high-voltage level-shifter of claim 2, wherein the input terminal has a voltage level equal to or less than 1.0 V, and the voltage supply VDD has a voltage level equal to or less than 1.0 V.

4. The high-voltage level-shifter of claim 1, wherein:
   a source of the first HVPMOS transistor and a source of the second HVPMOS transistor are connected to a supply voltage VHH;
   a gate of the first HVPMOS transistor, a drain of the second HVPMOS transistor, and a drain of the second native HVNMOS transistor are connected to an output terminal.

5. The high-voltage level-shifter of claim 1, wherein a source of the second LVNMOS transistor, a substrate of the first LVNMOS transistor, a substrate of the first native HVNMOS transistor, a substrate of the second native HVNMOS transistor, and a substrate of the second LVNMOS transistor are connected to a supply voltage VSS.

6. The high-voltage level-shifter of claim 1, wherein the high-voltage level-shifter comprises a gate bias supply voltage.

7. The high-voltage level-shifter of claim 1, wherein the high-voltage level-shifter comprises a constant single supply voltage.

8. The high-voltage level-shifter of claim 1, wherein:
   a drain of the first LVNMOS transistor and a source of the first native HVNMOS transistor are connected together;
   a gate of the first LVNMOS transistor and a gate of the first native HVNMOS transistor are connected to a supply voltage VDD;
   a source of the first HVPMOS transistor and a source of the second HVPMOS transistor are connected to a supply voltage VHH;
   a gate of the first HVPMOS transistor, a drain of the second HVPMOS transistor, and a drain of the second native HVNMOS transistor are connected to an output terminal;

in the event that a voltage level of 1.0 V or less is applied to the input terminal, the output terminal includes a voltage level that is about a voltage level of the supply voltage VHH.

9. The high-voltage level-shifter of claim 8, wherein the supply voltage VDD has a voltage level of 1.0 V or less, and the supply voltage VHH is greater than VDD.

10. A high-voltage level-shifter comprising:
a first high-voltage P-channel metal oxide semiconductor (HVPMOS) transistor having a source connected to a supply voltage VHH;
a second HVPMOS transistor having a source connected to the supply voltage VHH;
a discharge transistor comprising a first native high-voltage N-channel metal oxide semiconductor (HVNMOS) transistor and a first low-voltage N-channel metal oxide semiconductor (LVNMOS) transistor connected in series;
an avalanche transistor comprising a second native HVNMOS transistor and a second LVNMOS transistor connected in series, and
a supply voltage VDD connected to a gate of the first HVNMOS transistor and a gate of the first LVNMOS transistor, the supply voltage VDD being lower than the supply voltage VHH.

11. The high-voltage level-shifter of claim 10, further comprising:
an input terminal connected to a gate of the second LVNMOS transistor and a gate of the second native HVNMOS transistor.

12. The high-voltage level-shifter of claim 11, wherein:
a drain of the first LVNMOS transistor and a source of the first native HVNMOS transistor are connected together; and
a gate of the first HVPMOS transistor, a drain of the second HVPMOS transistor, and a drain of the second native HVNMOS transistor are connected to an output terminal;

when a voltage level of 1.0 V or less is applied to the input terminal, the output terminal is at a voltage level that is about the supply voltage VHH.

13. A high-voltage level-shifter comprising:
a first high-voltage P-channel metal oxide semiconductor (HVPMOS) transistor having a source connected to a supply voltage VHH;
a second HVPMOS transistor having a source connected to the supply voltage VHH;
a discharge transistor comprising a first native high-voltage N-channel metal oxide semiconductor (HVNMOS) transistor and a first low-voltage N-channel metal oxide semiconductor (LVNMOS) transistor connected in series;
an avalanche transistor comprising a second native HVNMOS transistor and a second LVNMOS transistor connected in series, and
an input terminal connected to a gate of the second LVNMOS transistor, a gate of the second native HVNMOS transistor, and a source of the first LVNMOS transistor.

14. The high-voltage level-shifter of claim 13, further comprising:
an output terminal connected to a gate of the first HVPMOS transistor, a drain of the second HVPMOS transistor, and a drain of the second native HVNMOS transistor,
wherein the output terminal is at about the supply voltage VHH when a voltage level of 1.0 V or less is applied to the input terminal.

15. The high-voltage level-shifter of claim 14, further comprising:
a voltage supply VDD connected to a gate of the first HVNMOS transistor and a gate of the first LVNMOS transistor, the supply voltage VDD being lower than the supply voltage VHH.

* * * * *